United States Patent
Kim et al.

(10) Patent No.: US 7,453,263 B2
(45) Date of Patent: Nov. 18, 2008

(54) REFERENCE CURRENT OPTIMIZING APPARATUS FOR CONTROLLING MAGNETIC FLUX-VOLTAGE CONVERSION CHARACTERISTIC OF DOUBLE RELAXATION OSCILLATION SQUID

(75) Inventors: Jin-Mok Kim, Daejeon (KR); Yong-Ho Lee, Daejeon (KR); Hyukchan Kwon, Daejeon (KR); Kiwoong Kim, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 135 days.

(21) Appl. No.: 11/496,304

(22) Filed: Jul. 31, 2006

(65) Prior Publication Data

US 2007/0296409 A1 Dec. 27, 2007

(30) Foreign Application Priority Data

May 9, 2006 (KR) .................. 10-2006-0041395

(51) Int. Cl.
*G01R 33/02* (2006.01)
(52) U.S. Cl. .................................. 324/248
(58) Field of Classification Search ............ 324/244, 324/248, 260; 505/845–874; 327/527; 257/31
See application file for complete search history.

(56) References Cited

U.S. PATENT DOCUMENTS 5,406,201 A * 4/1995 Kiryu et al. ............... 324/248

FOREIGN PATENT DOCUMENTS

KR 2002078325 * 10/2002

OTHER PUBLICATIONS

Yong-Ho Lee et al., "Multichannel applications of double relaxation oscillation SQUIDs," *Superconductor, Science and Technology*, 14(2001), pp. 1022-1026.

D.J. Adelerhof et al., "(Double) relaxation oscillation SQUIDs with high flux-to-voltage transfer: Simulations and Experiments," *Journal of Applied Physics*, 76(6), Sep. 15, 1994, pp. 3875-3886.

Richard P. Welty et al., "Two-Stage Integrated Squid Amplifier With Series Array Output," *IEEE Transactions on Applied Superconductivity*, vol. 3 No. 1, Mar. 1995, pp. 2605-2608.

D. Drung, "Digital feedback loops for d.c. SQUIDs," *Cryogenics* 1986 vol. 26 November, pp. 623-627.

(Continued)

*Primary Examiner*—Jay M Patidar
(74) *Attorney, Agent, or Firm*—The Webb Law Firm (57) ABSTRACT

A reference-current optimizing apparatus of a Reference Junction Double Relaxation Oscillation SQUID (RJ-DROS) with a signal SQUID and a reference junction for detecting a magnetic flux signal is provided. The reference-current optimizing apparatus includes a voltage controller for converting a digital signal into an output voltage; a buffer for receiving the output voltage and preventing a current generated in the RJ-DROS from flowing inversely into the reference-current optimizing apparatus; a low-pass filter for eliminating a noise mixed in an output voltage of the buffer; and a resistor for converting an output voltage of the low-pass filter into a current and providing both ends of the reference junction with the current. The reference-current optimizing apparatus may also include a preamplifier having a number of junction bipolar transistors.

7 Claims, 6 Drawing Sheets

OTHER PUBLICATIONS

Richard P. Welty et al., "A Series Array of DC SQUIDs," *IEEE Transactions on Magnetics*, vol. 27 No. 2 Mar. 1991, pp. 2924-2926.

M.J. Van Duuren et al., "The Use of (Double) Relaxation Oscillation SQUIDS as a Sensor," *IEEE Transactions on Applied Superconductivity*, vol. 7, No. 2, Jun. 1997, pp. 3469-3472.

S.A. Gugoshnikov et al., "Noise in Relaxation-Oscillation-Driven DC SQUIDs," *IEEE Transactions on Magnetics*, vol. 27 No. 2, Mar. 1991, pp. 2439-2441.

S.A. Gugoshnikov et al., "Relaxation-Oscillation-Driven DC SQUIDs," *IEEE Transactions on Magnetics*, vol. 25, No. 2, Mar. 1989, pp. 1178-1181.

\* cited by examiner

[fig. 1]

[Prior Art]

[fig. 2]

[Prior Art]

REFERENCE CURRENT OPTIMIZING APPARATUS FOR CONTROLLING MAGNETIC FLUX-VOLTAGE CONVERSION CHARACTERISTIC OF DOUBLE RELAXATION OSCILLATION SQUID

BACKGROUND OF THE INVENTION

1. Field of the Invention

The present invention generally relates to a Super-conducting Quantum Interference Device (SQUID), and more particularly, to a reference-current optimizing apparatus of a double relaxation oscillation SQUID.

2. Background of the Related Art

In general, a SQUID refers to a high-sensitivity magnetometer that can detect up to a minute magnetic flux density of a $10^{-15}$ T (tesla) scale by employing the Josephson effect (i.e., an effect in which when electrons pairs are tunneled between two super-conducting rings, the super-conductivity of the super-conducting ring junction collapses at a critical current value and the magnetic flux enters the super-conducting ring accordingly). More particularly, a Double Relaxation Oscillation SQUID (hereafter, referred to as "DROS") has a great magnetic flux-voltage characteristic and a high conversion coefficient, and it can detect a rapid magnetic flux signal using a simple pre-amplifier.

Figure 1:
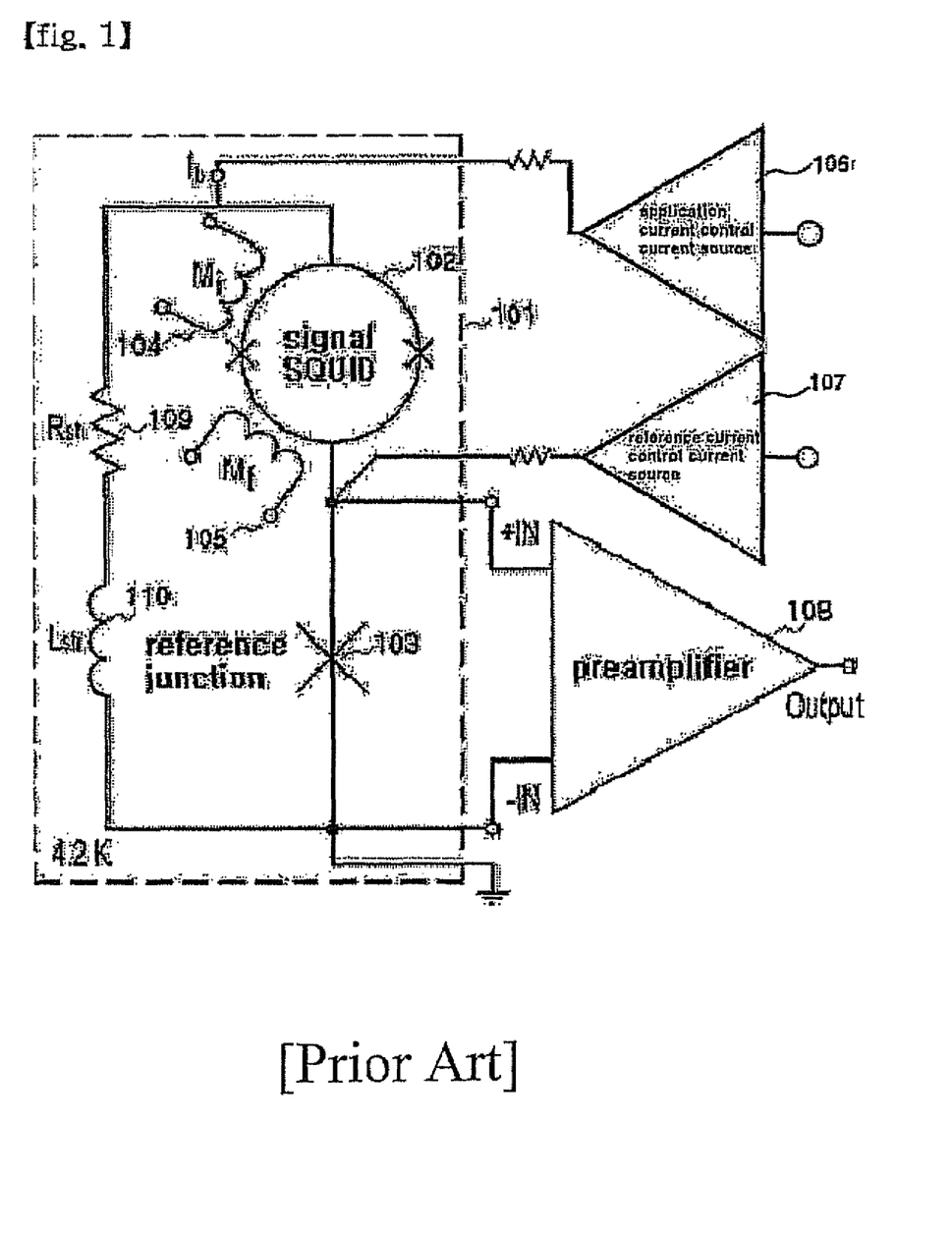
FIG. 1 is a schematic diagram of a RJ-DROS equivalent circuit and a control apparatus.

FIG. 1 shows a current source for driving a Reference Junction DROS (hereinafter, referred to as "RJ-DROS") and an overall construction for detecting the output of the DROS.

A RJ-DROS 101 includes a signal SQUID 102 and a reference junction 103. The RJ-DROS 101 is disadvantageous in that it has a fixed reference current since the reference junction is used, but is advantageous in that it has a simple structure and convenient operation in comparison with a Reference SQUID DROS (hereinafter, referred to as "RS-DROS") having two SQUIDs.

An external magnetic flux reacts through an input coil $M_i$ 104 of the signal SQUID 102 and a feedback coil $M_f$ 105 is used when the DROS operates in Flux-Locked Loop (FLL) mode. An application current $I_b$ for driving the RJ-DROS 101 is controlled using an application current control current source 106 at normal temperature. A reference current of the reference junction 103 is controlled using a reference current control current source 107. The output of the RJ-DROS 101 is detected by a preamplifier 108 at both ends of the reference junction 103.

Figure 2:
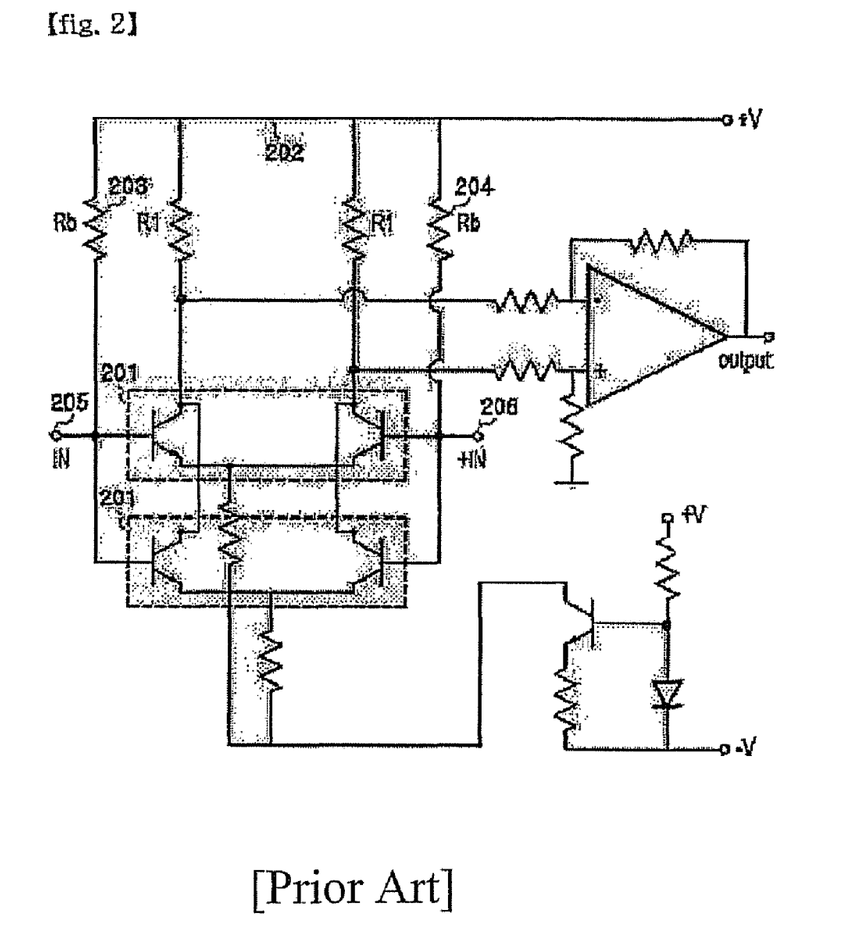
FIG. 2 is a circuit diagram in which a preamplifier having a plurality of junction bipolar transistors and a fixed application current circuit are combined.

FIG. 2 is a circuit diagram of a fixed current application circuit used to detect the output of the DROS that reacts to variation in the magnetic flux more accurately.

As shown in FIG. 2, in the fixed current application circuit, input terminals 205, 206 of a preamplifier having a plurality of junction bipolar transistors 201 are connected to the reference junction 103. To remove the input application current of the preamplifier, the fixed current application circuit includes a fixed voltage source 202 and fixed application resistors $R_b$ 203, 204.

In the related art DROS constructed above, a current must flow from the outside in order to control the reference current flowing through the reference junction. To this end, another electric wire through which the current can flow is further required. If another electric wire is added as described above, the number of connection lines are increased in the multi-channel system. Accordingly, problems arise because not only a thermal conduction phenomenon is generated, but also the fabrication of a low temperature insert system is complicated.

Meanwhile, the preamplifier having the plurality of junction bipolar transistors 201 with a low voltage noise is used in order to measure the output of the RJ-DROS. In this case, if the input application current of the preamplifier flows into the reference junction 103, the DROS may not operate or the characteristics of the DROS are changed, exceeding the optimal operating conditions. This hinders a stabilized DROS operation.

To avoid the problem, the fixed current application circuit including the fixed voltage source 202 and the fixed application resistors $R_b$ 203, 204 are used, as shown in FIG. 2. However, an application current generated from the fixed application current circuit is not constant because of the difference in the properties of electrons components of the circuit and heat generated from peripheral circuits. This causes the current to flow into the input terminals 202 of the reference junction 103. As a result, there is a possibility that the DROS may not operate or does not operate under optimal conditions as described above.

SUMMARY OF THE INVENTION

Accordingly, the present invention has been made in view of the above problems occurring in the prior art, and it is an object of the present invention to provide a reference-current optimizing apparatus of a DROS, in which it can improve the stability of the DROS operation by optimizing the reference current. More particularly, an object of the present invention is to provide a reference-current optimizing apparatus of a DROS, in which the magnetic flux-voltage characteristic of the DROS can be optimized by allowing the reference current of the reference junction to be changed easily, and the DROS can operate stably under optimal conditions by controlling the input application current of the preamplifier not to enter the reference junction.

Another object of the present invention is to provide a reference-current optimizing apparatus of a DROS, in which it can eliminate the difficulty of fabrication and a bad effect on the circuit properties, which are incurred by a complicated structure, by allowing the number of connection lines not to increase.

To achieve the above objects, according to an aspect of the present invention, there is provided a reference-current optimizing apparatus of a RJ-DROS, including a buffer connected to the RJ-DROS, for preventing a current from flowing inversely, a low-pass filter for eliminating noise, a voltage controller for applying a voltage, and a resistor connected between the voltage controller and the RJ-DROS, for controlling an amount of the current, wherein a current flows through the RJ-DROS. The reference-current optimizing apparatus is connected to a reference junction of the RJ-DROS, thus controlling a magnetic flux-voltage conversion characteristic of the RJ-DROS. When a reference current of a reference junction is changed by an input current of a preamplifier or the RJ-DROS exceeds an optimal condition, the reference-current optimizing apparatus is connected to the reference junction of the RJ-DROS, thus controlling the reference current to become an optimal reference current. When an input current of a preamplifier becomes higher than a critical current of a reference junction and the reference junction is saturated to a junction voltage, the reference-current optimizing apparatus is connected to the reference junction of the RJ-DROS, thus offsetting the input current of the preamplifier.

According to another aspect of the present invention, there is provided a reference-current optimizing apparatus of a DROS, including a preamplifier for receiving electrical power from an apparatus according to claim 1 through an input electrical wire and causing a current to flow through the RJ-DROS, the preamplifier including a plurality of junction bipolar transistors. The input electric wire of the preamplifier serves as a reference current control electric wire. The reference-current optimizing apparatus is connected to a reference junction of the RJ-DROS, thus controlling a reference current, and a voltage of the reference junction is measured by removing an input current of the preamplifier. The reference-current optimizing apparatus is connected to a reference SQUID of a Reference SQUID DROS, and a voltage of the reference SQUID is measured by removing an input current of the preamplifier.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

A reference-current optimizing apparatus of a DROS according to an embodiment of the present invention will now be described in detail with reference to the accompanying drawings.

In the related art RJ-DROS, not only the critical current $I_{c2}$ of the reference junction is fixed, but also the critical current $I_{c2}$ operates within the helium Dewar in which a temperature of 4.2K is maintained. This makes it difficult to control the critical current of the reference junction externally. In an embodiment of the present invention, in order to eliminate such inconvenience, an optimizing apparatus is constructed to control the critical current of the reference junction outside the 4.2K helium Dewar.

Figure 3:
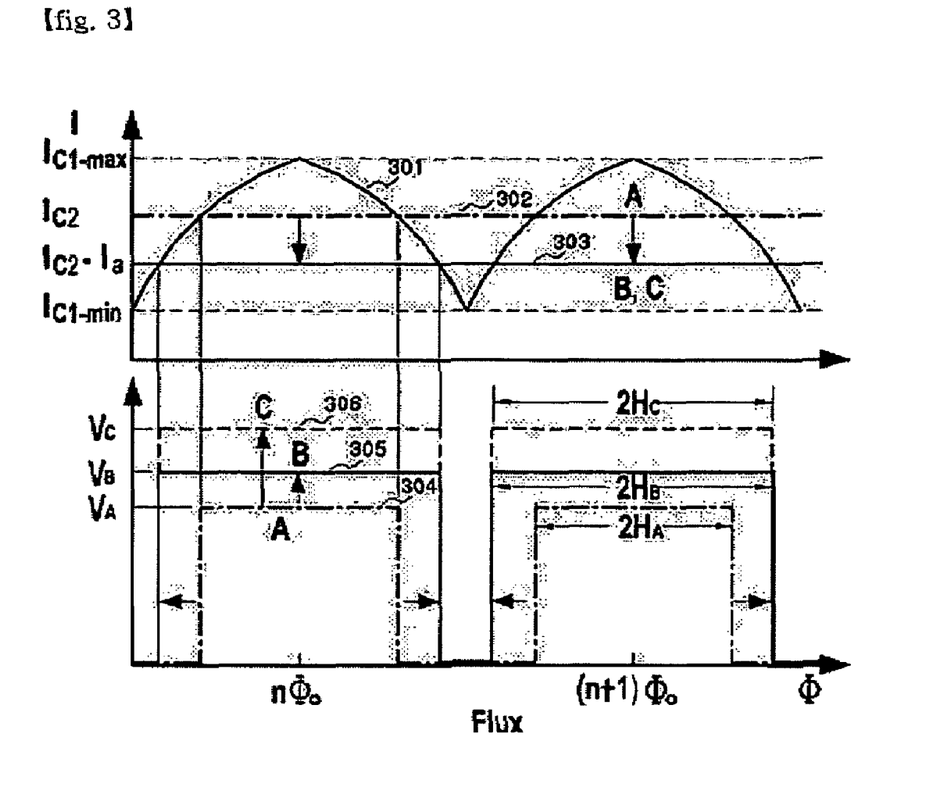
FIG. 3 is a graph illustrating the relationship between variation in the magnetic flux-voltage characteristic of the DROS and variation in a signal magnetic flux and a reference current.

When a current $I_a$ flows across the reference junction, the reference current at the reference junction becomes $(I_{c2}-I_a)$ The result of comparing the reference current with the critical current of the signal SQUID depending on variation in the magnetic flux is shown at an upper graph of FIG. 3. A fixed reference current $I_{c2}$ 302 is changed into $(I_{c2}-I_a)$ 303 by means of the added current $I_a$. At this time, the magnetic flux-voltage characteristic generated from the reference junction is shown at a lower graph of FIG. 3.

An averaged relaxation voltage $V_A$ of the reference junction depending on variation in the external magnetic flux when the reference current is $I_{c2}$ is indicated by reference numeral "304" in FIG. 3, and an averaged relaxation voltage $V_C$ of the reference junction when the reference current is $(I_{c2}-I_a)$ is indicated by reference numeral "306" in FIG. 3, according to the critical current $I_{c1}$ 301 of the signal SQUID depending on variation in the magnetic flux.

As the current $I_a$ rises, a magnetic flux-voltage modulation width increases from $2H_A$ to $2H_C$, as shown at the lower graph of FIG. 3. In this case, in the case of the RS-DROS, the averaged relaxation voltage at the reference SQUID is $V_B$ indicated by a point B as the reference current $(I_{c2}-I_a)$ rises.

Meanwhile, the critical current $I_{c2}$ of the reference junction becomes $I_{c2} \leq I_{c1-min}$ or $I_{c2} \geq I_{c1-max}$ and therefore exceeds the critical current range of the signal SQUID, which reacts to the magnetic flux. When the DROS does not operate, the critical current $I_{c2}$ is controlled to become $I_{c1-min}<I_{c2}<I_{c1-max}$ using the optimizing apparatus by applying a current to the reference junction, so that the DROS can operate stably.

Figure 4:
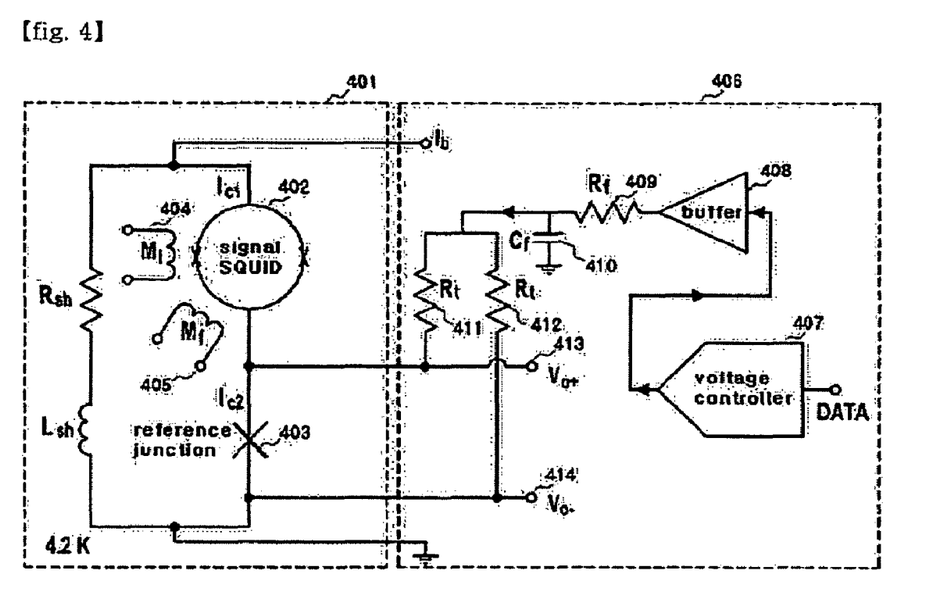
FIG. 4 is a circuit diagram of a reference current optimizing apparatus connected to a RJ-DROS according to an embodiment of the present invention.

FIG. 4 is a circuit diagram in which a RJ-DROS and a reference current optimizing apparatus are combined.

The RJ-DROS 401 operates within the helium Dewar of 4.2K and the reference current optimizing apparatus 406 operates at normal temperature. The output of the optimizing apparatus 406 is connected to both ends 413, 414 of a reference junction 403. A current is input to the reference junction 403 in order to change the reference current.

The optimizing apparatus 406 includes fixed resistors $R_t$ 411, 412 used in the voltage-the current conversion, a low-pass filter, a buffer 408, and a voltage controller 407, as shown in FIG. 4. A voltage applied to the fixed resistors $R_t$ 411, 412 is converted into a current. When the output voltage of the voltage controller 407 is $V_t$, a current $I_t$ $(=V_t/R_t)$ flows across the reference junction 402.

The low-pass filter is a primary RC filter having a capacitor 409 and a resistor 410, and it serves to eliminate noise included in the output from the voltage controller 407. The buffer 408 serves to prevent the current, which is generated from the DROS, from inversely flowing through the optimizing apparatus 406.

The voltage controller 407 is a digital/analog voltage converter that converts a digital signal, which is received from a computer, into a voltage. The application current range and resolving power of the optimizing apparatus 406 are decided by The application current range and resolving power of the output voltage of the voltage controller 407.

Figure 5:
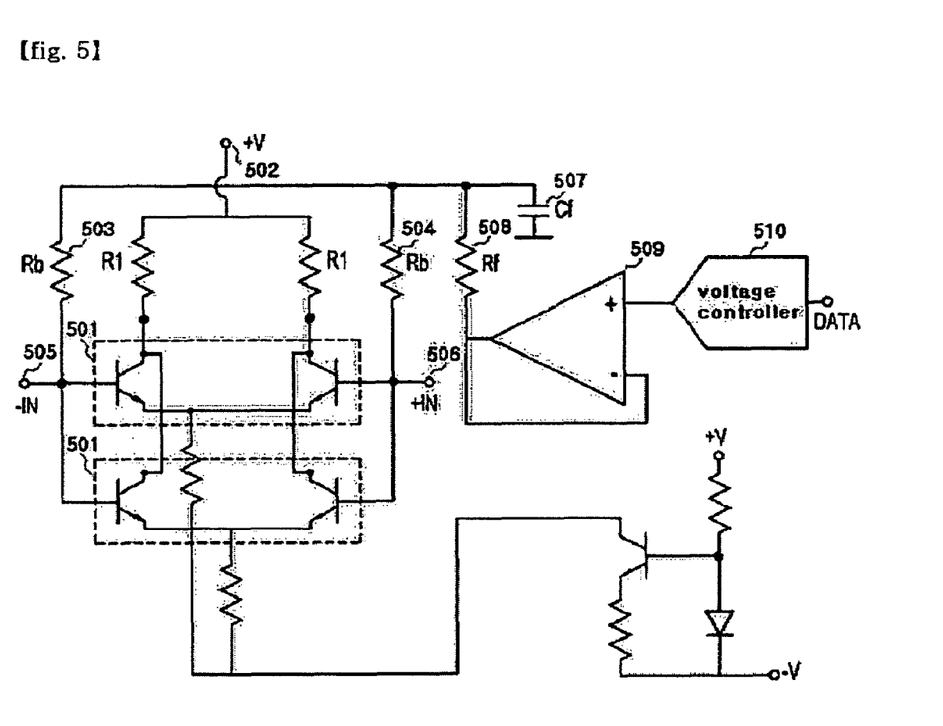
FIG. 5 is a circuit diagram in which a preamplifier having a plurality of junction bipolar transistors and a reference current optimizing apparatus are combined.

FIG. 5 is a circuit diagram in which a preamplifier having a plurality of junction bipolar transistors and a reference current optimizing apparatus are combined.

In the preamplifier, as the number of junction transistors 501 connected in parallel is increased, input voltage noise reduces to $V_n/\sqrt{n}$. Therefore, a larger number of the junction transistors 501 needs to be connected in order to obtain low input voltage noise. However, there is a problem in that the more the number of the junction transistors 501 connected in parallel, the higher the input application current. Therefore, the optimizing apparatus of FIG. 4 is connected in order to eliminate the input application current.

The output terminal of the optimizing apparatus is connected to resistors 503, 504 and input terminals 505, 506 of the preamplifier, so that an optimized current flows through the transistor input terminals. A voltage controller 510 generates a voltage according to the number of the junction transistors 501 connected in parallel to the preamplifier. The resistors 503, 504 generate a current through a buffer 509 and low-pass filters 507, 508 and connect the generated current to the input terminals 505, 506 of the preamplifier.

When a voltage of the voltage controller 510 is $V_t$ and a resistance is $R_t$, the current $I_t$ of the optimizing apparatus becomes $V_t/R_t$. The current flows through the input terminals of the preamplifier, thus producing an input application current necessary for the junction bipolar transistors connected in parallel. The ability of the optimizing apparatus to control the input application current may be decided by a voltage control range and resolving power of the voltage controller 510.

Figure 6:
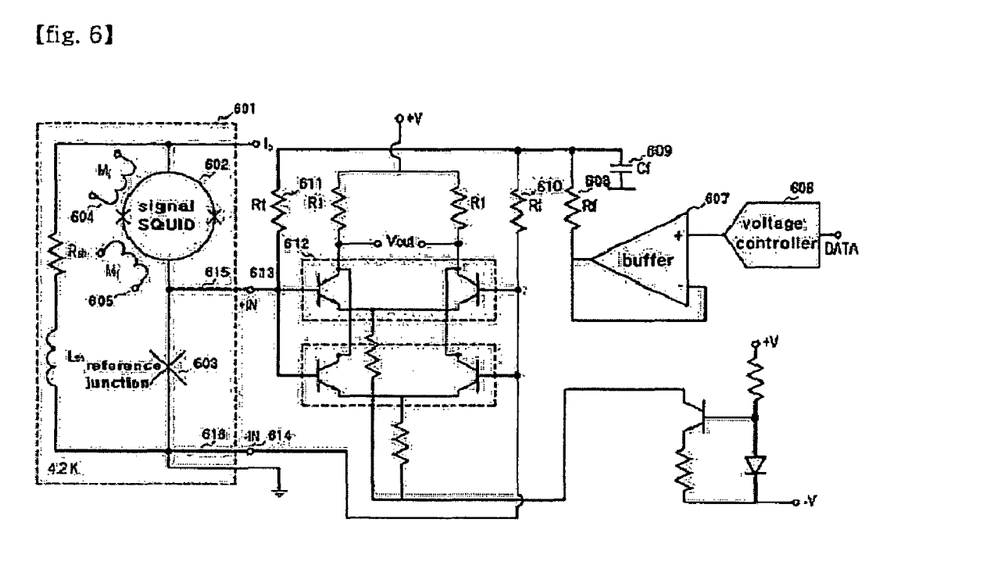
FIG. 6 is a circuit diagram in which the RJ-DROS, the reference current optimizing apparatus, and the preamplifier are combined.

FIG. 6 is a circuit diagram in which the optimizing apparatus is connected to a RJ-DROS 601 and a preamplifier having a plurality of junction bipolar transistors 612 detects a signal at both ends of a reference junction 603.

The RJ-DROS 601 includes a signal SQUID 602 and the reference junction 603. Both ends of the reference junction 603 and input terminals 613, 614 of the preamplifier are connected by voltage sensing electric wires 615, 616, respectively. Accordingly, the voltage of the reference junction 603 can be detected. Current output terminals of voltage-current conversion resistors 610, 611 of the optimizing apparatus are connected to the input terminals 613, 614 of the preamplifier at normal temperature. Therefore, an optimized current can be transmitted through the voltage sensing electric wires 615, 616.

As described above, the reference current is controlled using the connection lines of the preamplifier. Accordingly, in an embodiment of the present invention, the optimizing circuit for controlling the reference current does not require new electric wires.

Furthermore, the input application current of the preamplifier can be offset by the current of the optimizing circuit and an optimal magnetic flux-voltage characteristic of the DROS can be obtained by controlling the reference current of the reference junction. When the output current from the optimizing apparatus is $I_t$ and the input application current of the preamplifier is $I_{input-bias}$, the reference current at the reference junction of the DROS is $(I_{c2}-I_t+I_{input-bias})$ When the reference current of the RJ-DROS exceeds the critical current range of the signal SQUID, the DROS can be controlled to have a point at which an averaged relaxation voltage and a conversion coefficient are the highest (an optimal condition) in the magnetic flux-voltage characteristic of the DROS, by controlling the current flowing through the reference junction using the optimizing apparatus.

Meanwhile, when the critical current of the reference junction exceeds the critical current range of the signal SQUID, it can be controlled to fall within an operating range using the optimizing apparatus so that the DROS can operate stably.

Furthermore, when the input application current of the preamplifier flows into the reference junction and the reference current exceeds the optimal condition, the reference current can be controlled to have the optimal condition using an optimized current.

Meanwhile, if the input application current of the preamplifier is higher than the critical current of the reference junction, the DROS does not operate since a saturation voltage is generated at the reference junction. However, the DROS can be driven stably by offsetting the input application current flowing through the reference junction using the optimizing apparatus.

In addition, the RS-DROS may use a preamplifier having a plurality of junction bipolar transistors in order to detect the output stably. At this time, if the input application current of the preamplifier is higher than a critical current of the reference junction, the DROS does not operate normally due to a saturation state.

To solve the problem, the optimizing apparatus of the present invention may be used to prevent the input application current of the preamplifier from flowing into the reference SQUID, thereby obtaining a stabilized output voltage.

As described above, according to the present invention, the optimizing apparatus of the present invention is connected to the RJ-DROS in order to vary the reference current, which was fixed at the reference junction in the related art. Accordingly, the DROS can have a high response level and can operate stably, by controlling the magnetic flux-voltage conversion characteristic.

Furthermore, when the RJ-DROS is fabricated, reference junctions having different critical currents are controlled to have the same reference current. Accordingly, there is an advantage in that the reference junctions can have the same magnetic flux-voltage characteristic.

In addition, a preamplifier having a plurality of junction bipolar transistors serves to prevent an input application current of the preamplifier from flowing into the optimizing apparatus when the output of a reference junction is detected. This enables the DROS to operate normally.

Furthermore, a junction bipolar transistor type preamplifier having low input voltage noise can be connected to the DROS. Accordingly, a magnetocardiogram or magnetoencephalography system having the DROS can detect signals stably.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A reference-current optimizing apparatus of a Reference Junction Double Relaxation Oscillation SQUID (RJ-DROS) with a signal SQUID and a reference junction for detecting a magnetic flux signal, comprising:

a voltage controller for converting a digital signal into an output voltage;

a buffer for receiving the output voltage and preventing a current generated in the RJ-DROS from flowing inversely into the reference-current optimizing apparatus;

a low-pass filter for eliminating a noise mixed in an output voltage of the buffer; and a resistor for converting an output voltage of the low-pass filter into a current and providing both ends of the reference junction with the current.

2. The reference-current optimizing apparatus of claim 1, wherein the reference-current optimizing apparatus is connected to the reference junction of the RJ-DROS, thus controlling a magnetic flux-voltage conversion characteristic of the RJ-DROS.

3. The reference-current optimizing apparatus of claim 1, wherein a preamplifier is connected to both ends of the reference junction, and when a reference current of the reference junction is changed by an input current of the preamplifier or the RJ-DROS exceeds an optimal condition, the reference-current optimizing apparatus is connected to the reference junction of the RJ-DROS, thus controlling the reference current to become an optimal reference current.

4. The reference-current optimizing apparatus of claim 1, wherein a preamplifier is connected to both ends of the reference junction, and when an input current of the preamplifier becomes higher than a critical current of the reference junction and the reference junction is saturated to a junction voltage, the reference-current optimizing apparatus is connected to the reference junction of the RJ-DROS, thus offsetting the input current of the preamplifier.

5. A reference-current optimizing apparatus of a DROS, comprising:
 a preamplifier for receiving electrical power from an apparatus according to claim 1 through an input electrical wire and causing a current to flow through the RJ-DROS, the preamplifier including a plurality of junction bipolar transistors.

6. The reference-current optimizing apparatus of claim 5, wherein the input electric wire of the preamplifier serves as a reference current control electric wire.

7. The reference-current optimizing apparatus of claim 5, wherein the reference-current optimizing apparatus is connected to a reference junction of the RJ-DROS, thus controlling a reference current, and
 a voltage of the reference junction is measured by removing an input current of the preamplifier.

* * * * *